United States Patent
Asakawa et al.

[11] Patent Number: 5,863,699
[45] Date of Patent: Jan. 26, 1999

[54] PHOTO-SENSITIVE COMPOSITION

[75] Inventors: Koji Asakawa, Kawasaki; Toru Ushirogochi, Yokohama; Naomi Shida, Kawasaki; Makoto Nakase, Tokyo, all of Japan

[73] Assignee: Kabushiki Kaisha Toshiba, Kawasaki, Japan

[21] Appl. No.: 728,388

[22] Filed: Oct. 9, 1996

[30] Foreign Application Priority Data

Oct. 12, 1995 [JP] Japan ................................. 7-263829

[51] Int. Cl.⁶ ............................................. G03F 7/004
[52] U.S. Cl. ................................ 430/270.1; 430/280.1; 430/905; 430/914; 430/922; 430/927; 522/31
[58] Field of Search ............................. 430/270.1, 927, 430/922, 914, 905, 280.1; 522/31

[56] References Cited

U.S. PATENT DOCUMENTS

| | | | |
|---|---|---|---|
| 4,026,705 | 5/1977 | Crivello et al. | 430/914 |
| 4,136,102 | 1/1979 | Crivello | 430/914 |
| 4,264,703 | 4/1981 | Crivello | 430/270.1 |
| 4,491,628 | 1/1985 | Ito et al. | 430/270.1 |
| 4,537,854 | 8/1985 | Crivello | 430/914 |
| 4,603,101 | 7/1986 | Crivello | 430/270.1 |
| 5,002,856 | 3/1991 | Anderson | 430/914 |
| 5,279,923 | 1/1994 | Hiro et al. | 430/270.1 |
| 5,320,931 | 6/1994 | Umehara et al. | 430/270.1 |
| 5,624,787 | 4/1997 | Watanabe et al. | 430/270.1 |

FOREIGN PATENT DOCUMENTS

| | | |
|---|---|---|
| 0 249 139 | 12/1987 | European Pat. Off. |
| 36 20 677 | 4/1987 | Germany . |
| 37 21 741 | 1/1989 | Germany . |
| 5-4953 | 1/1993 | Japan . |
| 6-95390 | 4/1994 | Japan . |
| 6-199770 | 7/1994 | Japan . |

*Primary Examiner*—John S. Chu
*Attorney, Agent, or Firm*—Oblon, Spivak, McClelland, Maier & Neustadt, P.C.

[57] ABSTRACT

A photosensitive composition for forming a pattern through a light-exposure with either one of ArF excimer laser and $F_2$ excimer laser, which comprises a compound having either an acid-decomposable or acid-crosslinkable group, and a compound represented by the following general formula (1):

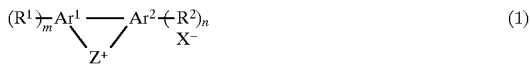

wherein $Ar^1$ and $Ar^2$ are individually an aromatic ring or condensed aromatic ring, $R^1$ and $R^2$ are individually halogen atoms or monovalent organic group, X is a group selected from the group consisting of $CF_3SO_3$, $CH_3SO_3$, $CF_3COOH$, $ClO_4$, $SbF_6$ and $AsF_6$, Z is a group selected from the group consisting of Cl, Br, I, S—R and Se—R (R is an alkyl group having 1 to 10 carbon atoms or perfluoroalkyl group having 1 to 10 carbon atoms), and m and n are 0 or a positive integer.

22 Claims, 4 Drawing Sheets

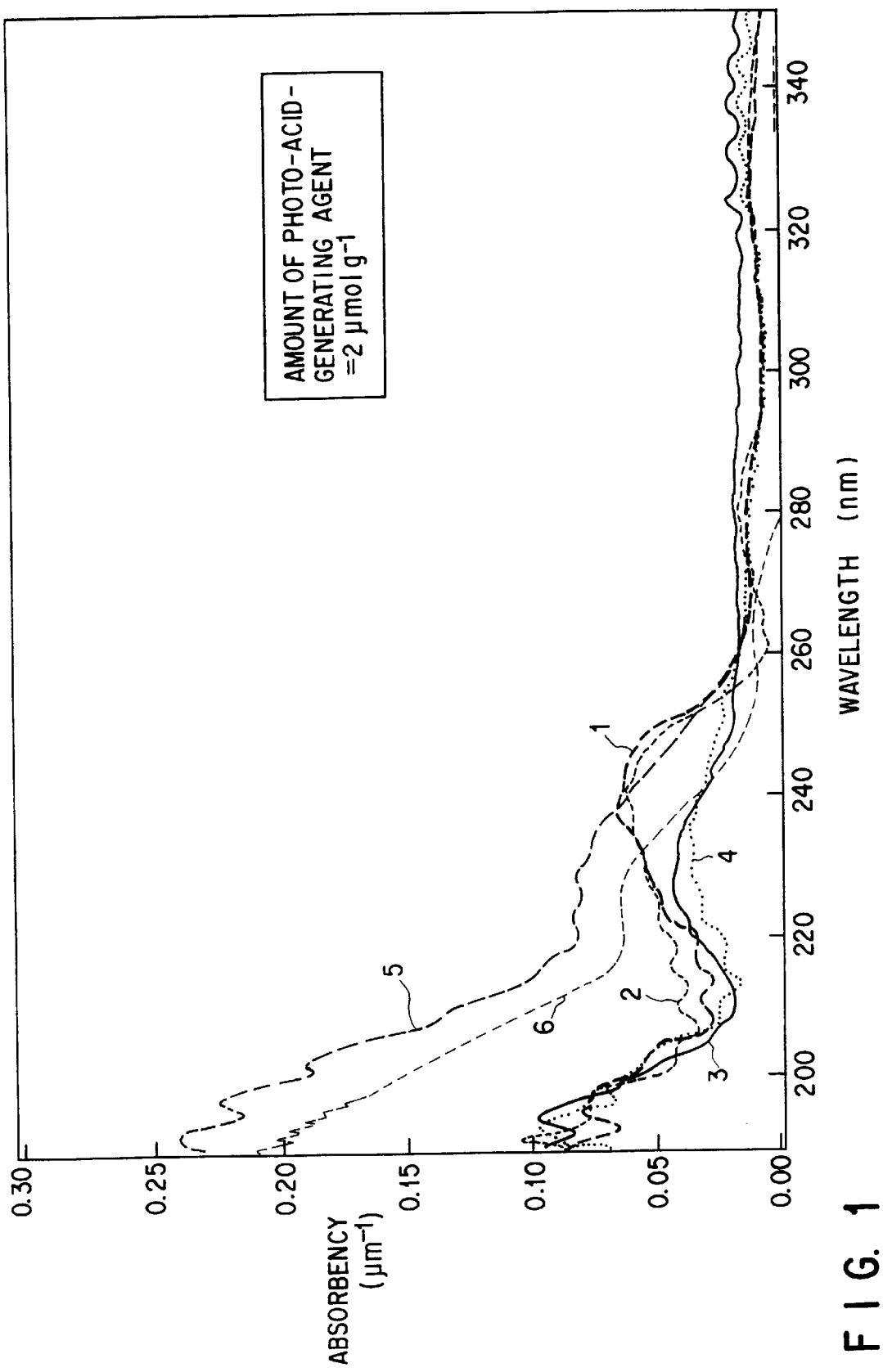
F I G. 1

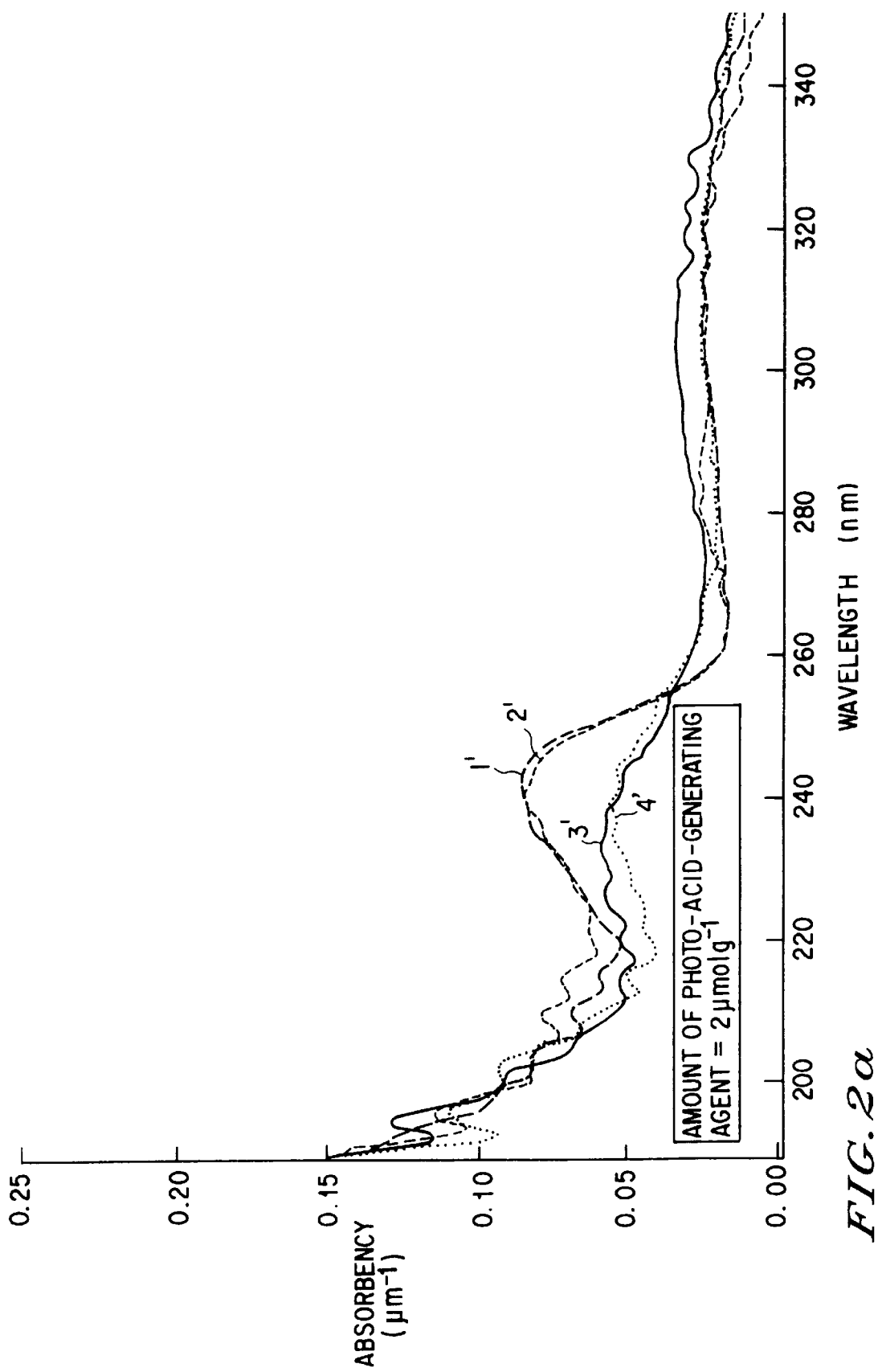

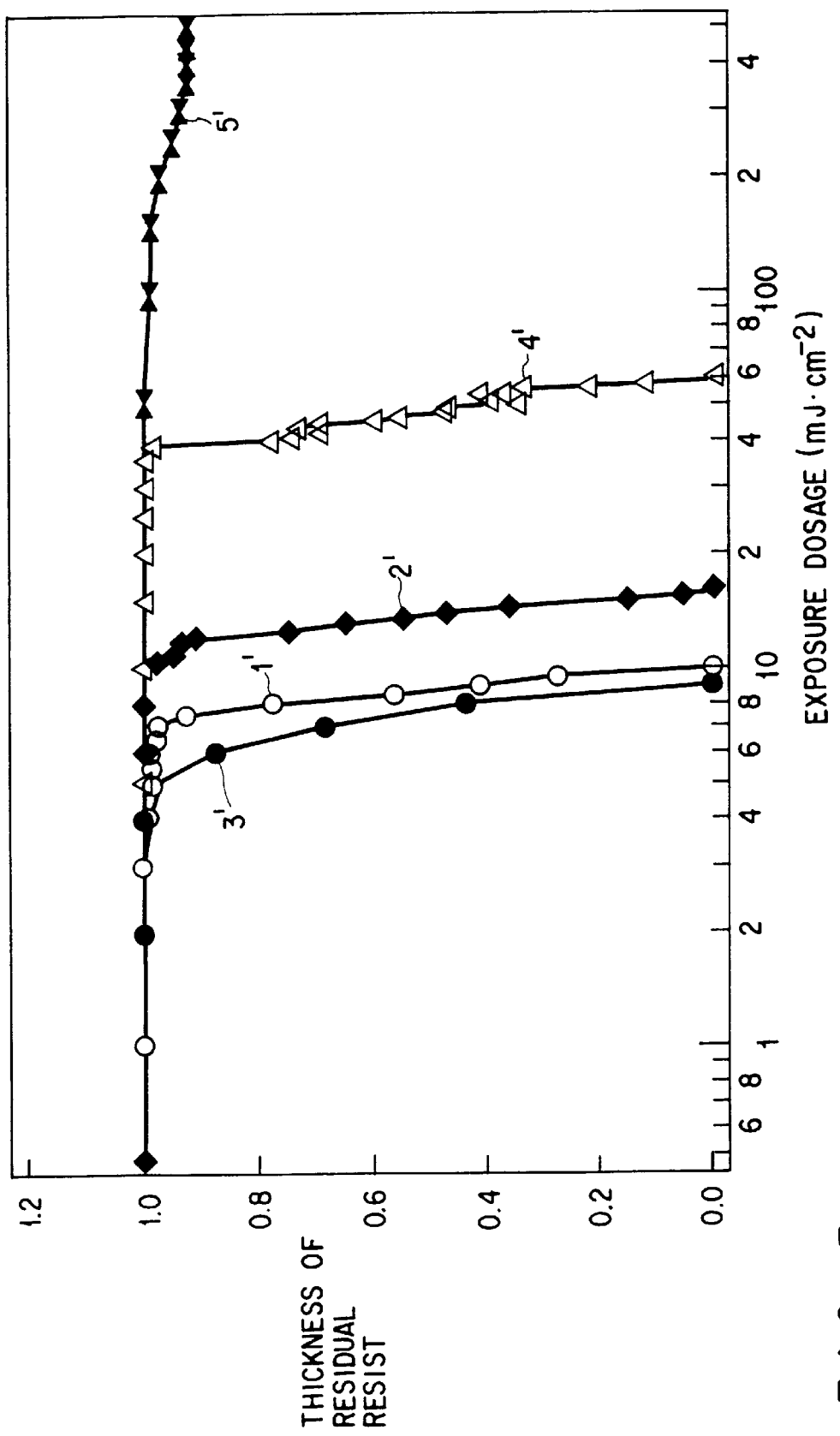
F I G. 3

PHOTO-SENSITIVE COMPOSITION

BACKGROUND OF THE INVENTION

1. Field of the Invention

This invention relates to a photosensitive composition which is useful for a fine working in the manufacture of a semiconductor element and the like.

2. Description of the Related Art

In the manufacture of electronic parts such as an LSI, a fine working technique utilizing a photo-lithography has been employed. In this fine working technique, a resist material is commonly employed. In particular, in order to cope with a recent trend to further increase the integration density of electronic parts, the formation of extremely fine patterns of resist film is now required in the manufacture of electronic parts.

Under such a circumstance, attempts to use a light of shorter wavelength as a light source in the formation of resist film pattern is now progressing. Namely, methods for forming an ultra-fine resist pattern through the use of KrF excimer laser beam (248 nm in wavelength) or through the irradiation of an ionizing radiation such an electron beam or X-rays have been developed. At the same time, various kinds of resist material which are highly sensitive to the aforementioned light sources have been reported.

For example, Japanese Patent Unexamined Publication S/63-27829 discloses a chemically amplified resist consisting of a composition comprising an alkali-soluble resin, a solubility-inhibiting agent and a photo-acid-generating agent. According to a chemically amplified resist of this kind, the solubility of a resist to an alkali-developing agent is inhibited by the solubility-inhibiting agent at the non-exposure portion, while an acid is generated from the photo-acid-generating agent at the exposure portion so as to decompose the solubility-inhibiting agent in the following baking step after the light exposure. As a result, the portion of the resist that has been exposed to light is made soluble by an alkali developing agent. In this case, even if the amount of the acid generated from the photo-acid-generating agent is very little in the chemically amplified resist, it is still capable of decomposing a large amount of the solubility-inhibiting agent, so that an ultra-fine pattern can be generally obtained with high sensitivity.

Meanwhile, with the advancement of high integration density as seen in an LSI, the formation of a pattern having a line width in the order of sub-half micron has been made possible by the latest fine working technique. This trend of forming a finer pattern is expected to be more accelerated in future. Therefore, the utilization of a light of shorter wavelength as a light source in photolithography is now studied, i.e. the utilization of ArF excimer laser beam (193 nm in wavelength) or the quintuple harmonic beam of YAG laser (218 nm in wavelength) for the formation of a fine resist pattern is tried at present. Moreover, a study of an exposure with $F_2$ excimer laser beam is also now attempted.

However, since the aforementioned conventional chemically amplified resist generally includes as a photo-acid-generating agent an aryl onium salt having a benzene ring, such a chemically amplified resist tends to exhibit a large light absorption by the benzene ring thereof when a light of short wavelength as mentioned above is employed. Therefore, it is impossible, because of this large light absorption, to allow the exposure light to reach deep enough to an interface between the resist film and the substrate during the light exposure in the formation of a resist pattern, thus making it very difficult to form a fine pattern which is excellent in shape and in precision.

As explained above, although the conventional chemically amplified resist may be useful for forming an ultra-fine pattern with high sensitivity when the g-line or i-line (each being an emission line from a low pressure mercury lamp) or KrF excimer laser beam (248 nm in wavelength) is employed as a light source, the conventional chemically amplified resist is still unsuited for forming a resist pattern of excellent resolution when ArF excimer laser beam is employed as a light source, because of its poor transparency to ArF excimer laser beam light.

SUMMARY OF THE INVENTION

Accordingly, the object of the present invention is to provide a photo-sensitive composition, which is excellent in transparency and highly sensitive to a light of short wavelength such as ArF excimer laser beam and $F_2$ excimer laser beam, and capable of forming a fine resist pattern with a high resolution.

According to this invention, there is provided a photo-sensitive composition for forming a pattern through a light-exposure with either one of ArF excimer laser and $F_2$ excimer laser, which comprises:

a compound having an acid-decomposable group; and a compound represented by the general formula (1):

wherein $Ar^1$ and $Ar^2$ are individually an aromatic ring or condensed aromatic ring; $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; Z is a group selected from the group consisting of Cl, Br, I, S—R and Se—R (R is an alkyl group having 1 to 10 carbon atoms or perfluoroalkyl group having 1 to 10 carbon atoms); and m and n are 0 or a positive integer.

According to this invention, there is further provided a photosensitive composition for forming a pattern through a light-exposure with either one of ArF excimer laser and $F_2$ excimer laser, which comprises a resin having an acid-decomposable group and a compound represented by the following general formula (1):

wherein $Ar^1$ and $Ar^2$ are individually an aromatic ring or condensed aromatic ring; $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; Z is a group selected from the group consisting of Cl, Br, I, S—R and Se—R (R is an alkyl group having 1 to 10 carbon atoms or perfluoroalkyl group having 1 to 10 carbon atoms); and m and n are 0 or a positive integer.

According to this invention, there is further provided a A photosensitive composition for forming a pattern through a light-exposure with either one of ArF excimer laser and $F_2$ excimer laser, which comprises a compound having an acid-crosslinkable group and a compound represented by the following general formula (1):

(1)

wherein $Ar^1$ and $Ar^2$ are individually an aromatic ring or condensed aromatic ring; $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; Z is a group selected from the group consisting of Cl, Br, I, S—R and Se—R (R is an alkyl group having 1 to 10 carbon atoms or perfluoroalkyl group having 1 to 10 carbon atoms); and m and n are 0 or a positive integer.

According to this invention, there is further provided a photosensitive composition for forming a pattern through a light-exposure with either one of ArF excimer laser and $F_2$ excimer laser, which comprises a resin having an acid-crosslinkable group and a compound represented by the following general formula (1):

(1)

wherein $Ar^1$ and $Ar^2$ are individually an aromatic ring or condensed aromatic ring; $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; Z is a group selected from the group consisting of Cl, Br, I, S—R and Se—R (R is an alkyl group having 1 to 10 carbon atoms or perfluoroalkyl group having 1 to 10 carbon atoms); and m and n are 0 or a positive integer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description given above and the detailed description of the preferred embodiments given below, serves to explain the principles of the invention.

FIG. 1 is a diagram illustrating an ultraviolet absorption spectrum of a composition containing a photo-acid-generating agent;

FIG. 3 is a diagram showing photo-sensitivity of photo-sensitive compositions of this invention and the Comparative Examples.

DETAILED DESCRIPTION OF THE PREFERRED EMBODIMENTS

Figure 2B:
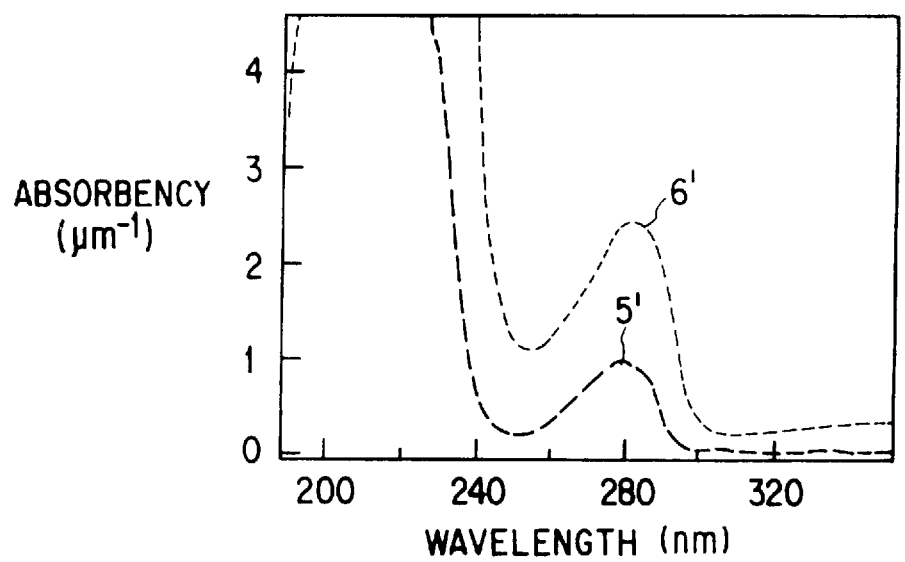
FIG. 2 is a diagram illustrating ultraviolet absorption spectra of photo-sensitive compositions of this invention and the Comparative Examples.

This invention will be further explained as follows.

The photo-sensitive composition of this invention includes for example a chemically amplified resist of positive type which comprises an alkali-soluble resin, a compound having an acid-decomposable group which is capable of inhibiting solubility to an alkali solution (hereinafter referred to as a solubility-inhibiting agent), and a photo-acid-generating agent. In this case, instead of employing the aforementioned solubility-inhibiting agent, the alkali-soluble group of the alkali-soluble resin may be protected with an acid-decomposable group having a solubility-inhibiting property so as to formulate the photo-sensitive composition with this resin and a photo-acid-generating agent.

Furthermore, the photo-sensitive composition of this invention also includes for example a chemically amplified resist of negative type which comprises an alkali-soluble resin, a compound having a crosslinkable group which is capable of cross-linking the alkali-soluble resin in the presence of an acid, and a photo-acid-generating agent. In this case, instead of employing the aforementioned compound having a crosslinkable group, an alkali-soluble resin having a crosslinkable group may be employed so as to formulate the photo-sensitive composition with this resin and a photo-acid-generating agent.

As for the examples of the aforementioned alkali-soluble resin to be employed in the photo-sensitive composition of this invention, resins having an aromatic ring or a condensed aromatic ring each having a hydroxyl group, or resins having a carboxyl group may be employed. Specific examples of these resins are acrylic acid derivatives; methacrylic acid derivatives; acrylonitrile derivatives; styrene derivatives; a polymer of acrylic acid or derivatives thereof, a polymer of methacrylic acid or derivatives thereof, a polymer of acrylonitrile derivatives, a polymer of styrene derivatives; a copolymer of isopropenyl phenol with acrylic acid or the derivatives thereof, methacrylic acid or the derivatives thereof, acrylonitrile or the derivatives thereof, styrene or derivatives thereof; a copolymer of styrene or derivatives thereof with acrylic resin, acrylic acid or the derivatives thereof, methacrylic acid or the derivatives thereof, acrylonitrile or the derivatives thereof; 4-hydroxy maleimide resin; polyamic acid; and any of these compounds into which silicon atom is introduced. These alkali-soluble resins may be employed singly or in combination with a view to adjust the alkali-solubility of a photo-sensitive composition of this invention.

It is preferable, in view of improving the dry etch resistance of the alkali-soluble resin of this invention without damaging the transparency to a light of short wavelength such as ArF excimer laser beam, to employ a alkali-soluble resin having a condensed aromatic ring introduced with hydroxy group or having an alicyclic skeleton introduced if required with an acid substituent group. As for the condensed aromatic ring, a naphthalene ring, an anthracene ring or phenanthrene may be employed. Specifically, a naphthol novolak resin which can be formed by condensing a carbonyl compound such as formaldehyde with naphthol or derivative thereof, or polymers of vinylnaphthalene, vinylnaphthol, vinylanthracene and vinylanthol may be employed.

On the other hand, as for the aforementioned alicyclic skeleton, a cyclic compound represented by a general formula $C_pH_{2p}$ (p is an integer of 3 or more), bicyclic compound and condensed rings of these cyclic compound can be employed. Specific examples thereof include cyclobutane; cyclopentane; cyclohexane; cycloheptane; any of above-mentioned monocyclic compounds attached with a bridging hydrocarbon; a spiro ring such as spiroheptane or spirooctane; a terpene ring such as norbornyl, adamanthyl, bornene, menthyl or menthane; a steroid skeleton such as thujane, sabinene, thujone, carane, carene, pinane, norpinane, bornane, fenchane, tricyllene or cholesteric ring; bile acid; digitaloid; camphoric ring; isocamphoric ring; sesquiterpene; santonic ring; diterpene; triterpene; and steroidsaponin. Specifically, a copolymer of a polymerizable compound having a alicyclic skeleton with a vinyl compound having an alkali-soluble group can be employed as the aforementioned alkali-soluble resin.

As for the acidic substituent group to be optionally introduced into the alicyclic skeleton, a group whose pKa is 7 to 11 in an aqueous solution of 25° C. is preferable for use. For example, an organic group having a keto-oxime structure such as propanone oxime, propanal oxime, hydroxyiminopentanone and dimethylglyoxime; an organic group having a dicarboxylic imide or N-hydroxysuccinic imide structure such as succine imide and pirolydine dione; an organic group having a dicarbonyl methylene structure such as cyclopentene 1,3-dione, acetylacetone and 3-methyl-2,4-pentadione; an organic group having thiol such as hexane thiol; an organic group having a tautomeric alcohol such as hydroxycyclopentenone or furfuryl alcohol; an organic group having an amic acid structure; an organic group having a phenolic hydroxyl group such as phenol, cresol and salicylaldehyde; and an organic group having a triazine skeleton may be used.

The

The average molecular weight of aforementioned alkali-soluble resin according to this invention should preferably be 500 to 500,000. If the average molecular weight of the alkali-soluble resin is less than 500, it may be difficult to form a resist film having a sufficient mechanical strength. On the other hand, if the average molecular weight of the polymer compound exceeds over 500,000, it may be difficult to form a resist film having an excellent resolution.

The mixing ratio of the alkali-soluble resin in the solid matters of the photo-sensitive composition of this invention should preferably be set to 5 to 85% by weight. Namely, if the mixing ratio is less than 5%, the coating properties of the photo-sensitive composition may be deteriorated. On the other hand, if the mixing ratio exceeds over 85%, it may become difficult to obtain a photo-sensitive composition having a sufficient sensitivity.

If the photo-sensitive composition of this invention is to be used as a chemically amplified resist of positive type, a compound having an acid-decomposable group which is capable of inhibiting solubility to an alkali solution is generally incorporated as a solubility-inhibiting agent. As for this solubility-inhibiting agent to be employed in this invention, a compound which exhibits a sufficient solubility-inhibiting property to an alkaline solution and is capable of generating radicals such as —(C=O)O—, —OS(=O)$_2$—, or —O— in an alkali solution as it is decomposed by an acid may be employed. The compound having an acid-decomposable group as mentioned above may be prepared by introducing an acid-decomposable group into a low molecular aromatic compound such as bisphenol A, bisphenol F, tri(hydroxyphenyl)methane, phenolphthalein, cresolphthalein, thymolphthalein, catechol, pyrogallol, naphthol, bisphenol A, bisphenol F and benzoic acid derivatives; or low molecular aliphatic alcohols such as cholate, steroids, terpenoid derivatives and saccarides.

Specific examples of such a compound are ones which can be derived by modifying phenolic compounds with t-butoxycarbonyl ether, tetrahydropyranyl ether, 3-bromotetrahydropyranyl ether, 1-methoxycyclohexyl ether, 4-methoxytetrahydropyranyl ether, 1,4-dioxan-2-yl-ether, tetrahydrofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triphenylsilyl ether, triisopropylsilyl ether, dimethylisopropylsilyl ether, diethylisopropylsilyl ether, dimethylcexylsilyl ether and t-butyldimethylsilyl ether. Among these compounds, preferable examples are those which can be derived by protecting the hydroxyl group of a phenolic compound with t-butoxycarbonyl group, t-butoxycarbonylmethyl group, trimethylsilyl group, t-butyldimethylsilyl group or tetrahydropyranyl group.

The solubility-inhibiting agent according to this invention may be esters of polycarboxylic acid, such as isopropyl ester, tetrahydropyranyl ester, tetrahydrofuranyl ester, methoxyethoxymethyl ester, 2-trimethylsilylethoxymethyl ester, t-butyl ester, trimethylsilyl ester, triethylsilyl ester, t-butyldimethylsilyl ester, isopropyldimethylsilyl ester, di-t-butyldimethylsilyl ester, oxazole, 2-alkyl-1,3-oxazoline, 4-alkyl-5-oxo-1,3-oxazoline and 5-alkyl-4-oxo-1,3-dioxsolane. The solubility-inhibiting agent according to this invention may be the following compounds. These solubility-inhibiting agents may be employed singly or in combination.

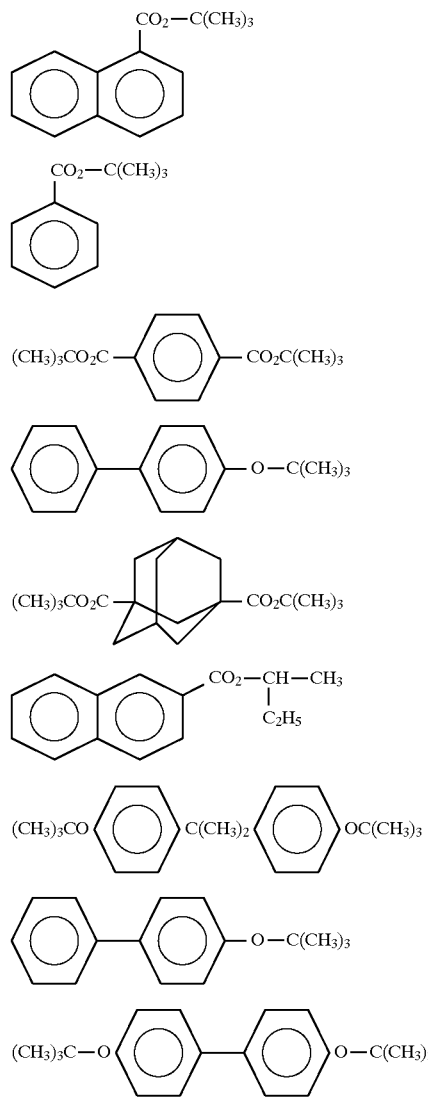

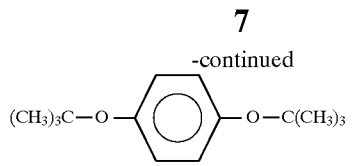
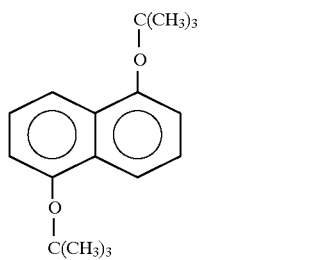
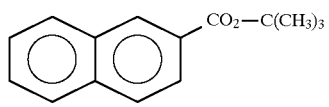
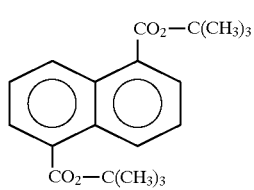
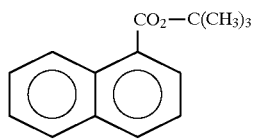
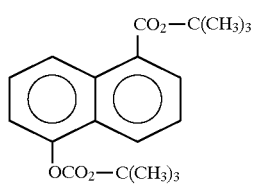
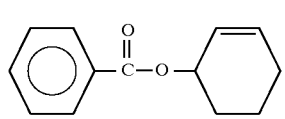
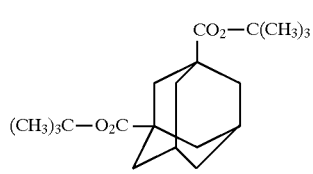
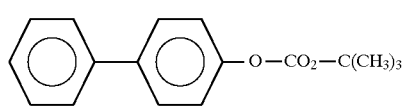
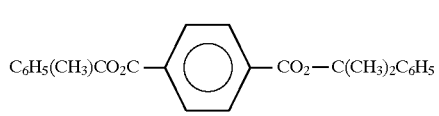
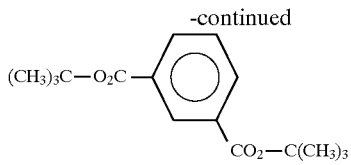
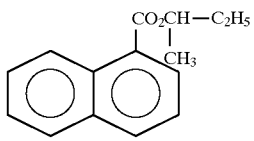
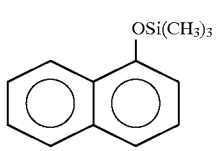
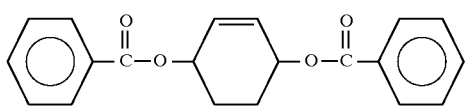
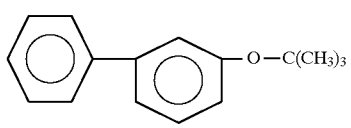
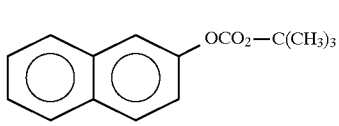
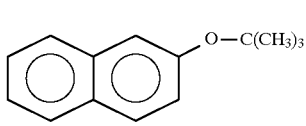
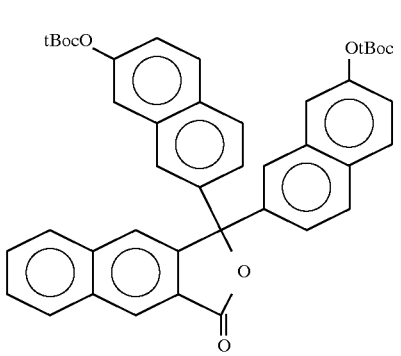
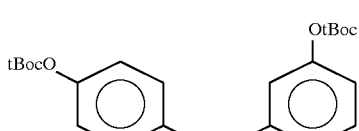
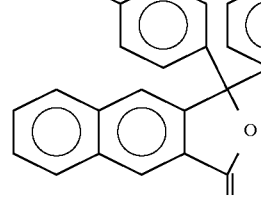

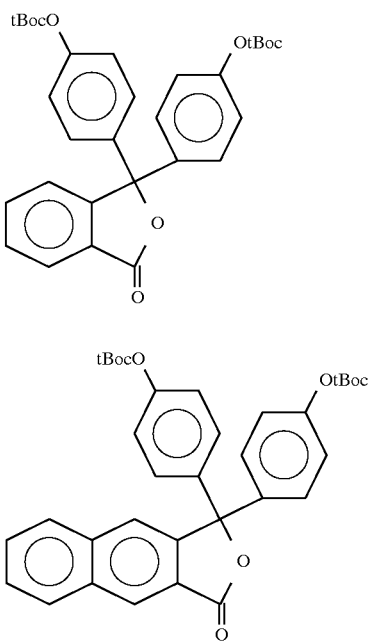
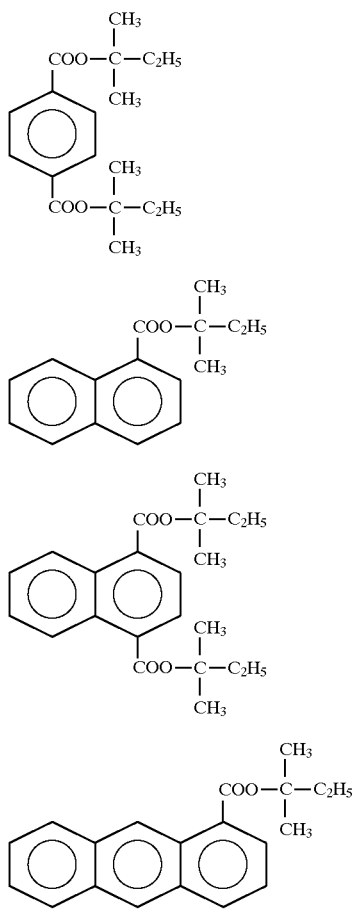
wherein tBoc is —(C═O)O—C(CH₃)₃
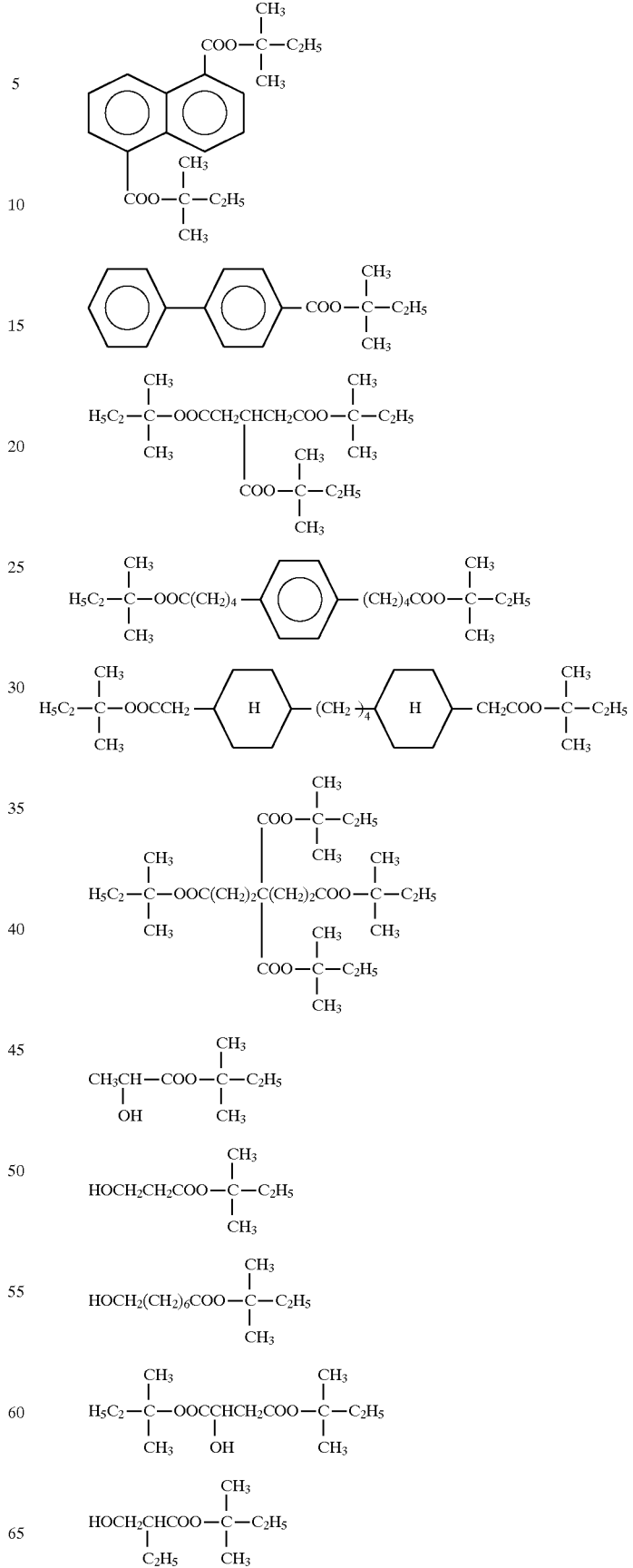

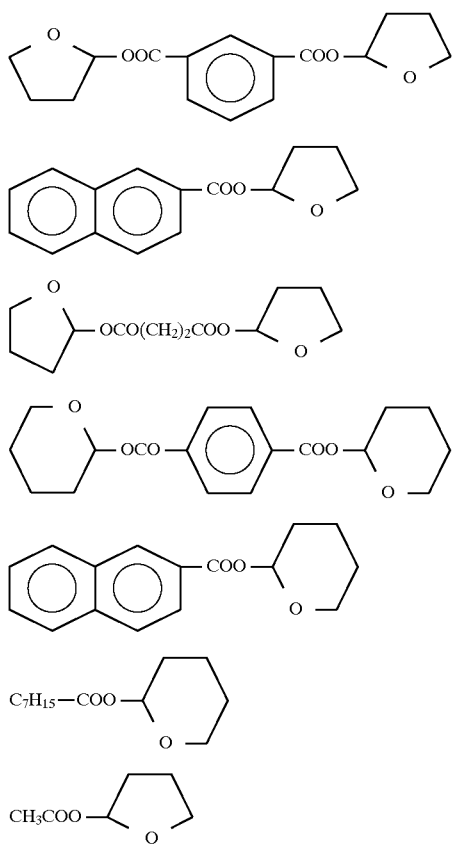

Out of these solubility-inhibiting agents, a conjugated polycyclic aromatic compound is more useful in this invention in view of its excellent transparency to the light of short wavelength. This conjugated polycyclic aromatic compound is formed of a skeleton wherein unsaturated bonds are arranged alternately, thus forming a non-condensed polycyclic or condensed polycyclic compound where a plurality of aromatic rings are flatly connected with each other. In the compound of this kind, the light absorption zone thereof is shifted to a longer wavelength region due to the conjugate stabilization of π electron, so that, with the employment of this conjugated polycyclic aromatic compound as a solubility-inhibiting agent in this invention, it is possible to obtain a photo-sensitive composition which is excellent in heat resistance, in transparency to the light of short wavelength and dry etching resistance. Accordingly, if a compound having a benzene ring is to be employed as a solubility-inhibiting agent, any of these conjugated polycyclic aromatic compounds or a low molecular aliphatic alcohol containing an acid-decomposable group should desirably be co-used together with the compound having a benzene ring.

Specific examples of such a conjugated polycyclic aromatic compound are compounds having any of naphthalene ring, anthracene ring, phenanthrene ring, pyrene ring, naphthacene ring, chrysene ring, 3,4-benzophenanthrene ring, perylene ring, pentacene ring, picene ring, pyrrole ring, benzofuran ring, benzothiophene ring, indole ring, benzoxazole ring, benzothiazole ring, indazole ring, chromene ring, quinoline cinnoline ring, phthalazine ring, quinazoline ring, dibenzofuran ring, carbazole ring, acridine ring, phenanthridine ring, phenanthroline ring, phenazine ring, thianthrene ring, indolizine ring, naphthyridine ring, purine ring, pteridine ring and fluorene ring.

Among them, condensed polycyclic compounds having a naphthalene ring, an anthracene ring or a phenanthrene ring are more excellent in transparency to the light of 193 nm in wavelength. Therefore, a polyhydroxy compound having any of these condensed aromatic ring structure whose hydroxyl group is protected with t-butylcarbonate, t-butyl ester, tetrahydropyranyl ether, acetal or trimethylsilyl ether are preferable in particular as a solubility-inhibiting agent.

The mixing ratio of the solubility-inhibiting agent in the photosensitive composition of this invention is preferably 0.1 to 40% by weight, more preferably 0.5 to 10% by weight based on the alkali-soluble resin. If the mixing ratio of the solubility-inhibiting agent is less than 0.1% by weight, it would be difficult to obtain a resist pattern excellent in resolution. On the other hand, if the mixing ratio of the solubility-inhibiting agent exceeds over 40% by weight, the coating properties of the resultant photosensitive composition may be deteriorated and at the same time the dissolution rate at the occasion of dissolving and removing the light-exposed portion of resist with an alkaline solution may be extremely lowered.

Instead of employing the aforementioned solubility-inhibiting agent, the alkali-soluble group of the alkali-soluble resin may be protected with an acid-decomposable group according to the photo-sensitive composition of this invention.

As for the acid-decomposable group, it is possible to employ esters such as isopropyl ester, tetrahydropyranyl ester, tetrahydrofuranyl ester, methoxyethoxymethyl ester, 2-trimethylsilylethoxymethyl ester, 3-oxocyclohexyl ester, isobornyl ester, trimethylsilyl ester, triethylsilyl ester, isopropyldimethylsilyl ester, di-t-butyldimethylsilyl ester, oxazole, 2-alkyl-1,3-oxazoline, 4-alkyl-5-oxo-1,3-oxazoline, 5-alkyl-4-oxo-1,3-dioxsolane; ethers such as t-butoxycarbonyl ether, t-butoxymethyl ether, 4-pentenyloxymethyl ether, tetrahydropyranyl ether, 3-bromotetrahydropyranyl ether, 1-methoxycyclohexyl ether, 4-methoxytetrahydropyranyl ether, 4-methoxytetrahydrothiopyranyl ether, 1,4-dioxan-2-yl ether, tetrahydrofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triphenylsilyl ether, triisopropylsilyl ether, dimethylisopropylsilyl ether, diethylisopropylsilyl ether, dimethylcexylsilyl ether and t-butyldimethylsilyl ether; acetals such as methylene acetal, ethylidene acetal, 2,2,2-trichloroethylidene acetal, 2,2,2-tribromoethylidene acetal and 2,2,2-triiodoethylidene acetal; ketals such as 1-t-butylethylidene ketal, isopropylidene ketal (acetonide), cyclopentylidene ketal, cyclohexylidene ketal and cycloheptylidene ketal; cyclic ortho-esters such as methoxymethylene acetal, ethoxymethylene acetal, dimethoxymethylene ortho-ester, 1-methoxyethylidene ortho-ester, 1-ethoxyethylidene ortho-ester, 1,2-dimethoxyethylidene ortho-ester, 1-N,N-dimethylaminoethylidene ortho-ester and 2-oxacyclopentylidene ortho-ester; silylketene acetals such as trimethylsilylketene acetal, triethylsilylketene acetal, triisopropylsilylketene acetal and t-butyldimethylsilylketene acetal; silyl ethers such as di-t-butylsilyl ether, 1,3-1',1',3',3'-tetraisopropyldisiloxanylidene ether and tetra-t-buthoxydisiloxane-1, 3-diylidene ether; acyclic acetals or ketals such as dimethyl acetal, dimethyl ketal, bis-2,2,2-trichloroethyl acetal, bis-2,2,2-tribromoethyl acetal, bis-2,2,2-triiodoethyl acetal, bis-2,2,2-trichloroethyl ketal, bis-2,2,2-tribromoethyl ketal, bis-2,2,2-triiodoethyl ketal, diacetyl acetal and diacetyl ketal; cyclic acetals or cyclic ketals such as 1,3-dioxane, 5-methylene-1,3-dioxane, 5,5-dibromo-1,3-dioxane, 1,3-dioxolane, 4-bromomethyl-1,3-dioxolane, 4,3'- butenyl-1,3-dioxolane and 4,5-dimethoxymethyl-1,3-dioxoran; cyanohydrines such as o-trimethylsilyl cyanohydrine, o-1-ethoxyethyl cyanohydrine and o-tetrahydropyranyl cyanohydrine.

Among them, those more preferable in view of their excellent acid-decomposability are esters such as t-butyl methacrylate, ethoxyethyl methacrylate, 3-oxocyclohexyl methacrylate, t-butyl-3-naphthyl-2-propenoate, isobornyl methacrylate, trimethylsilyl methacrylate and tetrahydropyranyl methacrylate. In this case, it is also possible to employ acrylates, $\alpha$-cyano acrylates and $\alpha$-methoxy acrylates in place of above exemplified methacrylates.

When a resin having any of the aforementioned acid-decomposable groups are to be employed in the photo-sensitive composition of this invention, the content of the resin should preferably be restricted to 5 to 95% by weight, based on the solid matters in the photo-sensitive composition. Because, if the content of the resin is less than 5% by weight, the coating properties of the photo-sensitive composition is liable to be deteriorated, whereas if the content of the resin exceeds over 95% by weight, it may become difficult to obtain a photo-sensitive composition having a sufficient sensitivity.

The resin having any of the aforementioned acid-decomposable groups may be used singly or in combination of two or more kinds in this invention. The resin having an acid-decomposable group may be co-used with an alkali-soluble resin, or these resins may be used in the form of a copolymer.

It may be also preferable in this invention to co-use a naphthol novolak or derivatives thereof having a molecular weight of not more than 2,000 as a solubility-inhibiting agent in addition to the compounds having the aforementioned acid-decomposable groups. However, when a resin containing an acid-decomposable group is employed, the naphthol novolak or derivatives thereof may be employed singly as a solubility-inhibiting agent.

If it is desired to use the photo-sensitive composition as a chemically amplified resist of negative type, a crosslinking agent, or a compound having an acid crosslinkable group which is capable of being crosslinked in the presence of an acid may be employed in place of the aforementioned solubility-inhibiting agent.

In this case, it is possible to employ, as the crosslinking agent, a vinyl compound having on its side chain an epoxy group, an acrylic acid or the derivatives thereof, or a melamine type compound such as methylol-substituted triazine, naphthyridine compounds. These crosslinking agents may be employed singly or in combination of two or more kinds.

The content of the crosslinking agent in the photo-sensitive composition of this invention is preferably 1 to 100% by weight, more preferably 5 to 30% by weight based on the amount of the alkali-soluble resin. If the mixing ratio of the crosslinking agent is less than 1% by weight, it would be difficult to obtain a resist pattern excellent in resolution. On the other hand, if the mixing ratio of the crosslinking agent exceeds over 100%, the coating properties of the photo-sensitive composition may be deteriorated.

Instead of employing the aforementioned crosslinking agent, an acid-crosslinkable group may be introduced into the alkali-soluble resin. Such a resin containing an acid-crosslinkable group may be prepared by introducing 10 to 40 mol. % (based on the alkali-soluble group of the alkali-soluble resin) of vinyl group or allyl group into the resin.

When a resin having any of the aforementioned acid-crosslinkable groups are to be employed in the photo-sensitive composition of this invention, the content of the resin should preferably be restricted to 1 to 95% by weight, based on the solid matters in the photo-sensitive composition. Because, if the content of the resin is less than 1% by weight, the coating properties of the photo-sensitive composition is liable to be deteriorated, whereas if the content of the resin exceeds over 95% by weight, it may become difficult to obtain a photo-sensitive composition having a sufficient sensitivity.

The resin having any of the aforementioned acid-crosslinkable groups may be used singly or in combination of two or more kinds in this invention. The resin having an acid-crosslinkable group may be co-used with an alkali-soluble resin, or these resins may be used in the form of a copolymer.

The average molecular weight of aforementioned resin according to this invention should preferably be 500 to 500,000 as in the case of the alkali-soluble resin, regardless of whichever group, i.e. the acid-decomposable group or the acid-crosslinkable group, the resin contains. Furthermore, it is possible to employ an alkali-soluble resin whose alkali-soluble group is replaced by an organic group excluding the acid-decomposable group or the acid-crosslinkable group, e.g. by methyl with a view to adjust the alkali-solubility of the photo-sensitive composition. This alkali-soluble resin can be employed in the same manner as explained above, i.e., it can be simply mixed or copolymerized with the alkali-soluble resin mentioned previously or with a resin containing an acid-decomposable group or an acid-crosslinkable group.

According to the photo-sensitive composition of this invention, a compound represented by the general formula (1) mentioned above is employed as an photo-acid-generating agent. This compound is featured in that a couple of benzene rings are directly linked through the ortho positions thereof, and hence the light absorption band of the compound is shifted toward the longer wavelength side, thus improving the transparency of the photo-sensitive composition to a light of short wavelength such as ArF excimer laser beam.

Namely, although an aryl onium salt having a benzene ring is generally employed as a photo-acid-generating agent according to the conventional chemically amplified resist, the employment of such a photo-acid-generating agent is accompanied with a problem that the light absorption by the benzene ring becomes prominent at a short wavelength region so that it is difficult, if a light of short wavelength is employed as a light source, to form a resist pattern of excellent resolution. Whereas, it has been found by the present inventors that if the conjugate length of the benzene ring in the aryl onium salt can be elongated, the light absorption peak of the $\pi-\pi$ could be shifted to the longer wavelength side, thus making it possible to improve the transparency of the photo-sensitive composition to a light of short wavelength. It has been also found by the present inventors on the basis of the aforementioned findings that if a couple of benzene rings are chemically bonded at the ortho positions of these benzene rings with each other as shown in the compound represented by the general formula (1), the relative rotation of these benzene rings would be prevented, thereby making it possible to arrange these benzene rings in a plane, thus resulting in a lowered energy state through the conjugation of $\pi$ clouds of these benzene rings, thereby opening the window of light transmission at the wavelength of about 193 nm of ArF excimer laser. This invention has been accomplished based on these findings by the present inventors.

As explained above, the compound represented by the general formula (1) which is to be employed as a photo-acid-generating agent in this invention indicates such a high quantum yield as it is irradiated with a radiation so as to generate an acid that even if it is compared with the case where a condensed aromatic ring such as naphthalene ring is substituted for the benzene ring of aryl onium salt so as to extend the conjugation of the π cloud, the transparency of the compound to a light of short wavelength such as ArF excimer laser beam is far superior. It should be noted that even if an aryl onium salt compound whose benzene ring is simply replaced by an alkyl group is employed, it would be difficult to obtain a sufficient quantum yield, and therefore such a compound would not be suited for use as a photo-acid-generating agent.

On the other hand, since the reaction efficiency of an acid-decomposable group or an acid-crosslinkable group that can be brought about by an acid generated from a photo-acid-generating agent, in other words, the catalytic performance of a photo-acid-generating agent is determined mainly by anion species X⁻ rather than by the structure of cation portion, the catalytic performance of the compound represented by the aforementioned general formula (1) is comparable to that of an aryl onium salt having a benzene ring, which has been conventionally employed as a photo-acid-generating agent. Therefore, it is possible, with the employment of the compound represented by the general formula (1) as a photo-acid-generating agent, to obtain a chemically amplified resist which is extremely sensitive to a light of short wavelength.

In the photo-acid-generating agent represented by the general formula (1) which can be employed in this invention, $Ar^1$ and $Ar^2$ denote as mentioned above an aromatic ring or condensed aromatic ring, such as benzene ring, naphthalene ring, anthracene ring, tetracene ring, pentacene ring, phenanthrene ring and pyrene ring. In particular, benzene ring is most preferable for $Ar^1$ and $Ar^2$ in view of its excellent sensitivity to a light of short wavelength. As for monovalent organic group to be optionally introduced into these aromatic ring or condensed aromatic ring as $R^1$ and $R^2$, methyl, methoxy, hydroxyl, ethyl, propyl, butyl and phenyl may be employed.

It is possible in this invention to substitute halogen atom, nitro group or cyano group for hydrogen atom of these organic group. However, from the viewpoint of transparency to a light of short wavelength such as ArF excimer laser beam, an organic group which is free from benzene ring is most preferable for $R^1$ and $R^2$. Additionally, from the viewpoint of forming a resist pattern excellent in resolution, an alkyl group having not more than 6 carbon atoms is preferable for $R^1$ and $R^2$.

If the Z in the aforementioned general formula (1) is S—R or Se—R, the R is selected from an alkyl group having 1 to 10 carbon atoms or perfluoroalkyl group having 1 to 10 carbon atoms. By the way, if the R is aryl group containing a benzene ring, the benzene ring will rotate in the molecule, thus possibly causing the benzene ring to take a posture which is non-planar in relative to that of the aromatic ring or condensed aromatic ring which are to be introduced as $Ar^1$ and $Ar^2$. Therefore, the conjugation of π clouds of benzene ring would not be extended, and hence the transparency of the resultant resist to a light of short wavelength such as ArF excimer laser beam can not be improved. Furthermore, from the viewpoint of solubility to a solvent for a photo-sensitive composition or from the viewpoint of the shape of resist pattern, perfluoroalkyl group is most preferable for the R. When these considerations are taken into account, the photo-acid-generating agent to be employed in the photo-sensitive composition of this invention should preferably be selected from at least one kind of the compounds represented by the following general formulas (2), (3) and (4).

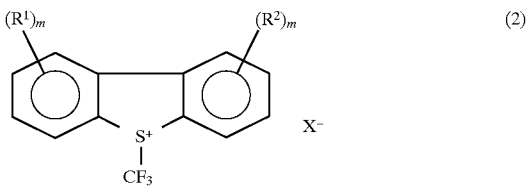

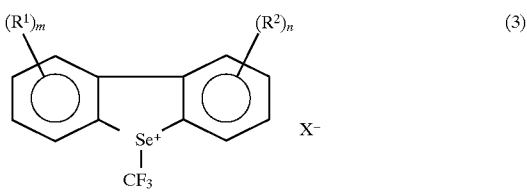

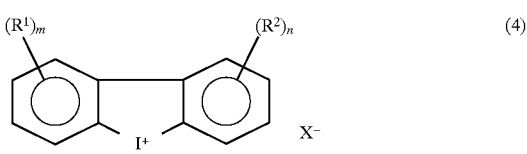

wherein $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; and m and n are 0 or a positive integer.

The content of the aforementioned photo-acid-generating agent, when it is employed in a chemically amplified resist of positive type of this invention, should preferably be 0.1 mol. % or more based on the acid-decomposable group in the resin and the solubility-inhibiting agent. This content of photo-acid-generating agent corresponds generally to about 0.01% by weight or more based on the solid matters in a photo-sensitive composition, though the value may change depending on the kind of the resin to be employed. More preferable content of the photo-acid-generating agent is in the range of 0.5 to 5 mol. % based on the acid-decomposable group. On the other hand, in the case of a chemically amplified resist of negative type of this invention, the content of the photo-acid-generating agent should preferably be 1 mol. % or more based on the acid-crosslinkable group in the resin and the crosslinking agent. This content of photo-acid-generating agent corresponds generally to about 2 to 5% by weight based on the solid matters in a photo-sensitive composition, though the value may change depending on the kind of the resin to be employed. More preferable content of the photo-acid-generating agent is in the range of 5 to 20 mol. % based on the acid-crosslinkable group.

The reason for limiting the content of photo-acid-generating agent to the aforementioned ranges is that if the content of this photo-acid-generating agent is too little, it would be difficult to obtain a photo-sensitive composition having a sufficiently high sensitivity. On the other hand, if the content of this photo-acid-generating agent is excessive, the coating properties of the resultant photo-sensitive composition liable to be deteriorated. It is possible according to this invention to use this photo-acid-generating agent singly or in combination of two or more kinds.

The photo-sensitive composition of this invention can be formulated into an ordinary varnish by dissolving each of the components in an organic solvent, and then filtering the resultant solution. It is also possible in the photo-sensitive composition of this invention to further incorporate therein other kinds of polymer such as epoxy resin, propyleneoxide-ethyleneoxide copolymer and polystyrene; an amine compound for improving environmental resistance; a basic compound such as pyridine derivatives; a surfactant for modifying a coated film; and a dye functioning as a reflection-preventing agent.

The organic solvents useful in this case are a ketone type solvent such as cyclohexanone, acetone, methylethyl ketone and methylisobutyl ketone; a cellosolve type solvent such as methylcellosolve, methylcellosolve acetate, ethylcellosolve acetate and butylcellosolve acetate; an ester type solvent such as ethyl acetate, butyl acetate, isoamyl acetate, γ-butyrolactone and 3-methoxy methylpropionate; a glycol type solvent such as propyleneglycol monomethylether acetate; a nitrogen-containing solvent such as dimethylsulfoxide, hexamethylphosphorictriamide, dimethylformamide and N-methylpyrrolidone; and a mixed solvent containing dimethylsulfoxide, dimethylformaldehyde or N-methylpyrrolidone in addition to any of the aforementioned solvents for the purpose of improving the solubility thereof. It is also possible to employ propionic acid derivatives such as methyl methylpropionate; lactates such as ethyl lactate; PGMEA (propyleneglycol monoethyl acetate); and propyleneglycol monomethyl acetate, since these solvents are low in toxicity. These solvents may be employed singly or in combination. These solvents may contain a suitable amount of aliphatic alcohol such as isopropyl alcohol, ethyl alcohol, methyl alcohol, butyl alcohol, n-butyl alcohol, s-butyl alcohol, t-butyl alcohol and isobutyl alcohol; or aromatic solvent such as xylene and toluene.

Followings are a detailed explanation on the process of forming a pattern by making use of a chemically amplified composition of positive type as a photosensitive composition of this invention.

The varnish of a resist material dissolved in an organic solvent as exemplified above is coated on the surface of a substrate by means of a spin-coating method or a dipping method. Then, the coated layer is dried at a temperature of 150° C. or less, or preferably at a temperature of 70° to 120° C. thereby forming a resist film. The substrate to be employed in this case may be for example a silicon wafer; a silicon wafer having an insulating film, electrodes or interconnecting wirings formed on the surface thereof; a blank mask; a Group III–V compounds (such as GaAs, AlGaAs) semiconductor wafer; a chrome- or chrome oxide-deposited mask; an aluminum-deposited substrate; an IBPSG-coated substrate; a PSG-coated substrate; an SOG-coated substrate; or a carbon film-sputtered substrate.

Then, the resist film is irradiated through a predetermined mask with chemical radiation, or the chemical radiation is directly scanned over the surface of the resist film. Since the photo-sensitive composition according to this invention is excellent in transparency not only to the light of short wavelength but also to the light of wide range of wavelength, the chemical radiation to be employed in this exposure may be ultraviolet rays; X-line; the i-line, h-line or g-line of low pressure mercury lamp light beam; a xenon lamp beam; a deep UV beam such as KrF or ArF excimer laser beam; $F_2$ excimer laser beam; a synchrotron orbital better to be synchrotron radiation (SR) radiation beam (SOR); an electron beam (EB); γ-rays; and an ion beam. In particular, when ArF excimer laser beam or $F_2$ excimer laser beam is employed as a light source, the effect of the photo-sensitive composition of this invention may become most prominent.

The resist film thus patterned is then subjected to a baking step by heating it at a temperature ranging from 50° to 180° C., more preferably from 60° to 120° C. using a hot plate or an oven, or through the irradiation of infrared rays. If the temperature at this baking step is lower than 50° C., a chemical reaction that may be brought about by an acid generated from the photo-acid-generating agent at the light exposure portions would not be promoted. On the other hand, if the temperature exceeds over 180° C., the photo-acid-generating agent may be decomposed thereby to generate an acid even at the non-exposure portions, thus possibly making it impossible to form a resist pattern of excellent resolution. It is possible to omit the aforementioned baking treatment, provided the resist film is left to stand for a sufficient time after the light exposure and prior to the development.

Subsequently, the resist film thus baked is subjected to a developing treatment by way of a dipping method or spraying method using an alkaline solution, thereby selectively removing the exposed portion or unexposed portion of the resist film to obtain a desired pattern. The alkaline solution useful as the developing solution may be an organic alkali aqueous solution such as an aqueous solution of tetramethylammonium hydroxide, an aqueous solution of trimethylhydroxyethylammonium hydroxide and an aqueous solution of choline; an inorganic alkali solution such as an aqueous solution of potassium hydroxide, sodium hydroxide, sodium carbonate, sodium silicate or sodium methasilicate. These alkaline solutions may be further added with alcohol or a surfactant. The concentration of these alkaline solutions should preferably be 15% by weight or less in view of obtaining a sufficient difference in dissolution rate between the exposed portion and the unexposed portion.

The resist pattern to be formed by making use of the photo-sensitive composition according to this invention is very excellent in resolution. For example, when a dry etching is performed with this resist pattern employed as an etching mask, an ultra-fine pattern having line width of the order of quarter micron can be accurately transferred onto an exposed surface of a substrate. Any additional steps may be included in the aforementioned process of forming a resist pattern. For example, a surface-flattening step for flattening the underlying layer of the resist film; a pretreatment step for improving the adhesion between the resist film and an underlying layer; a rinsing step for removing a developing solution with water for example after the development of the resist film; and a step of re-irradiating ultraviolet rays prior to dry etching may be included.

This invention will be further explained with reference to the following specific examples.

FIG. 1 shows a diagram illustrating an ultraviolet absorption spectrums of compositions containing a photo-acid-generating agent of this invention or a conventional photo-acid-generating agent, the content of the photo-acid-generating agent in any samples being 2 μmol per gram of a resin (S-lec; Sumitomo Kagaku Co.). The curves indicated by numerals 1 to 4 belong to the photo-sensitive compositions of this invention wherein S-(trifluoromethyl) dibenzothiophenium trifluoromethane sulfonic acid (PAG-1); Se-(trifluoromethyl)dibenzoselenophenium trifluoromethane sulfonic acid (PAG-2); I-dibenzoiodonophenium trifluoromethane sulfonic acid (PAG-3); and S-(perfluoroethyl)dibenzothiophenium trifluoromethane sulfonic acid (PAG-4), each being a photo-acid-generating agent, are added respectively to the photo-sensitive compositions. The curves indicated by numerals 5 and 6 belong to the conventional photo-sensitive compositions wherein triphenylsulfonium trifluoromethane sulfonic acid (TPS-OTf); and diphenyliodonium trifluoromethane sulfonic acid (DPI-OTf), each being a photo-acid-generating agent, are added respectively to the photo-sensitive compositions. The absorbency of the coated film of each of the aforementioned compositions shown in FIG. 1 is indicated by a value which had been normalized to that of the film having a thickness of 1 μm. The chemical formulas of the photo-acid-generating agents employed in this experiment are shown below.

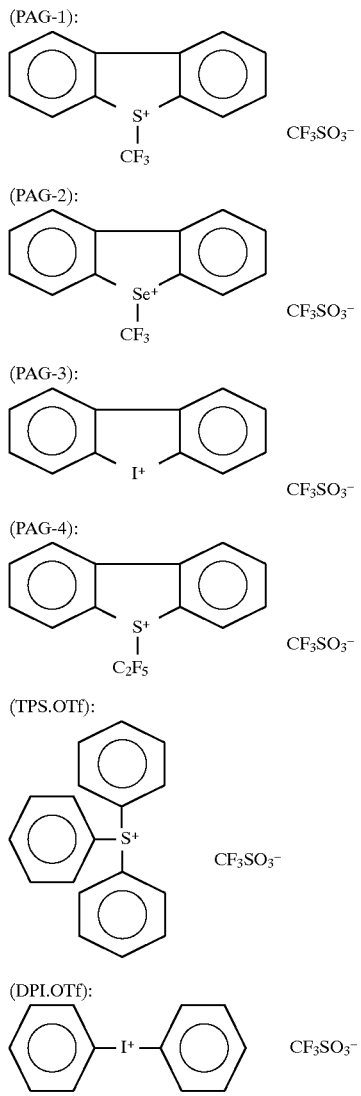

As seen from FIG. 1, the compositions containing the conventional photo-acid-generating agents indicated a large absorption peak in the vicinity of 193 nm in wavelength. Whereas, the compositions containing the photo-acid-generating agents of (PAG-1) to (PAG-4) indicated the opening of window in light transmission at the wavelength of about 193 nm, thus indicating an excellent transparency at the light of short wavelength region.

Each of these photo-acid-generating agents are then measured according the following equation with respect to their quantum yields per photon of 193 nm in wavelength in a polymethylmethacrylate (PMMA) (molecular weight: 20,000; Polyscience Co.).

Quantum yield=(the number of acid generated from a photo-acid-generating agent)/(the number of photon absorbed by the photo-acid-generating agent)

As a result, the quantum yields in the cases of (TPS-OTf) and (DPI-OTf) were found to be 0.036 and 0.032, respectively. Whereas, the quantum yields in the cases of (PAG-1) to (PAG-4) were found to be 0.16, 0.09, 0.22 and 0.13, respectively, thus indicating a satisfactory quantum yield that can be attained by the employment of the photo-acid-generating agents according to this invention.

In this measurement, the number of acid was defined as being the number of acid generated per unit volume of the polymer matrix. Specifically, the number of acid was determined by measuring the discoloration of an indicator comprising ethyl cellosolve acetate containing $7.9 \times 10^{-5}$ mol of tetrabromophenol blue sodium salt by making use of a UV spectroscope. On the other hand, the number of photon absorbed by the photo-acid-generating agents was calculated from a difference in transmittance between before and after these photo-acid-generating agents were mixed in the PMMA.

Then, the photo-acid-generating agents (PAG-1) to (PAG-4) were respectively mixed in a resin having a corresponding acid-decomposable group to prepare the photo-sensitive compositions of this invention, and the ultraviolet absorption spectra of the photo-sensitive compositions were measured. The alkali-soluble resin employed in this measurement was polyacrylic acid (weight average molecular weight: 20,000), into which t-butyl group was introduced as an acid-decomposable group via 30 mol. % of carboxyl group of the polyacrylic acid. The content of the photo-sensitive compositions was selected to be 2 μmol/g as in the case of the experiments shown in FIG. 1.

On the other hand, as comparative examples, a photo-sensitive composition for KrF excimer laser beam comprising polyhydroxystyrene (weight average molecular weight: 7,000) which was introduced with t-butyl group as an acid-decomposable group via 20 mol. % of hydroxyl group of the polyhydroxystyrene and 2 μmol/g of (TPS-OTf) as a photo-acid-generating agent; and a photo-sensitive composition for i-line comprising cresol novolak resin (weight average molecular weight: 5,500) which was introduced with 2 μmol/g of 2,3,4,4'-tetrahydroxybenzophenone-4-naphthoquinone diazidosulfonate as a photo-sensitive agent were prepared, and the ultraviolet absorption spectra of the photo-sensitive compositions were also measured. The results are shown in FIG. 2.

The ultraviolet absorption spectrum curves indicated by numerals 1' to 4' belong to the photo-sensitive compositions of this invention containing the photo-acid-generating agents (PAG-1) to (PAG-4), the ultraviolet absorption spectrum curve 5' belongs to the photo-sensitive composition for KrF excimer laser beam, and the ultraviolet absorption spectrum curve 6' belongs to the photo-sensitive composition for i-line. The absorbency of the resist film of each of the aforementioned compositions shown in FIG. 2 is indicated by a value which was normalized as in the case of FIG. 1 to that of the film having a thickness of 1 μm.

As seen from FIG. 2, the compositions according to this invention indicated an absorbency of 1 or less at the wavelength of 193 nm, thus indicating an excellent transparency to ArF excimer laser beam. Whereas, the compositions according to the comparative examples indicated an absorbency of as high as about 30 at the wavelength of 193 nm, thus indicating an insufficient transparency to ArF excimer laser beam.

Furthermore, the sensitivity to ArF excimer laser beam of the photo-sensitive compositions of this invention as well as of photo-sensitive composition for KrF excimer laser beam was measured. Namely, the resist films of the aforementioned photo-sensitive compositions each having a thickness of 0.6 μm were formed and then exposed to ArF excimer laser beam through a mask for measuring sensitivity. Then, the resultant resist film was subjected to a baking treatment at a temperature of 100° C. for 90 seconds and then developed with a 0.28N aqueous solution of tetramethylammonium hydroxide. Thereafter, the film thickness of each residual resist film after the development was measured. The sensitivity curves of these photo-sensitive compositions obtained in this manner were shown in FIG. 3. The residual film thickness of each resist film shown in FIG. 3 was normalized by a ratio of the residual film thickness to the film thickness when the film was initially formed.

The sensitivity curves indicated by numerals 1' to 4' belong to the photo-sensitive compositions of this invention containing the photo-acid-generating agents (PAG-1) to (PAG-4), and the sensitivity curve 5' belongs to the photo-sensitive composition for KrF excimer laser beam.

As seen from FIG. 3, the photo-sensitive composition for KrF excimer laser beam according to the comparative example was almost insensitive to ArF excimer laser beam, whereas the photo-sensitive compositions of this invention indicated a high sensitivity even to a light source of ArF excimer laser beam.

(EXAMPLE 1)

To 1.2 g of a resin comprising polyacrylic acid having t-butyl group introduced therein was added 0.06 g of a photo-acid-generating agent (PAG-1) to obtain a mixture, which was then dissolved into 8.8 g of ethyl cellosolve acetate to prepare a photo-sensitive composition of Example 1. This photo-sensitive composition was then coated on the surface of a silicon wafer by means of a spin-coating method at the rotational speed of 3,000 r.p.m. over a time period of 30 seconds. Then, the coated layer was dried on a hot plate at a temperature of 110° C. for 100 seconds thereby forming a resist film having a film thickness of 0.5 μm.

Then, the resist film was irradiated through a predetermined pattern of line-and-space with ArF excimer laser beam which was employed as a light source. The resist film thus light-exposed was then subjected to a baking step at a temperature of 100° C. for 180 seconds. Subsequently, the resist film thus baked was developed with a 0.28N aqueous solution of tetramethylammonium hydroxide at a temperature of 25° C. for 60 seconds to obtain a positive type resist pattern. As a result, it was possible with an exposure dosage of 38 mJ/cm$^2$ to form a line-and-space pattern having a line width of 0.35 μm.

(EXAMPLE 2)

The same procedures as explained in Example 1 repeated except that the photo-acid-generating agent (PAG-1) was replaced by the same amount of (PAG-2) thereby to form a positive type resist pattern. As a result, it was possible with an exposure dosage of 60 mJ/cm$^2$ to form a line-and-space pattern having a line width of 0.25 μm.

(EXAMPLE 3)

The same procedures as explained in Example 1 repeated except that the photo-acid-generating agent (PAG-1) was replaced by the same amount of (PAG-3) thereby to form a positive type resist pattern. As a result, it was possible with an exposure dosage of 31 mJ/cm$^2$ to form a line-and-space pattern having a line width of 0.30 μm.

(EXAMPLE 4)

The same procedures as explained in Example 1 repeated except that the photo-acid-generating agent (PAG-1) was replaced by the same amount of (PAG-4) thereby to form a positive type resist pattern. As a result, it was possible with an exposure dosage of 40 mJ/cm$^2$ to form a line-and-space pattern having a line width of 1.0 μm.

(EXAMPLE 5)

The same procedures as explained in Example 1 repeated except that the photo-acid-generating agent (PAG-1) was replaced by I-dibenzoiodonophenium trifluoroacetic acid thereby to form a positive type resist pattern. As a result, it was possible with an exposure dosage of 100 mJ/cm$^2$ to form a line-and-space pattern having a line width of 0.35 μm.

(EXAMPLE 6)

The same procedures as explained in Example 1 repeated except that the photo-acid-generating agent (PAG-1) was replaced by I-dibenzoiodonophenium methasulfonic acid thereby to form a positive type resist pattern. As a result, it was possible with an exposure dosage of 80 mJ/cm$^2$ to form a line-and-space pattern having a line width of 0.35 μm.

(EXAMPLE 7)

The same procedures as explained in Example 1 repeated except that the photo-acid-generating agent (PAG-1) was replaced by I-dibenzoiodonophenium hexafluoroantimonate thereby to form a positive type resist pattern. As a result, it was possible with an exposure dosage of 22 mJ/cm$^2$ to form a line-and-space pattern having a line width of 0.25 μm.

(EXAMPLE 8)

The same procedures as explained in Example 1 repeated except that the photo-acid-generating agent (PAG-1) was replaced by I-dibenzoiodonophenium tetrafluoroborate thereby to form a positive type resist pattern. As a result, it was possible with an exposure dosage of 15 mJ/cm$^2$ to form a line-and-space pattern having a line width of 0.25 μm.

(EXAMPLE 9)

The same procedures as explained in Example 1 repeated except that the photo-acid-generating agent (PAG-1) was replaced by I-dibenzoiodonophenium hexafluorophosphate thereby to form a positive type resist pattern. As a result, it was possible with an exposure dosage of 25 mJ/cm$^2$ to form a line-and-space pattern having a line width of 0.25 μm.

(EXAMPLE 10)

The same procedures as explained in Example 1 repeated except that the photo-acid-generating agent (PAG-1) was replaced by I-dibenzoiodonophenium hexafluoroarsenate thereby to form a positive type resist pattern. As a result, it was possible with an exposure dosage of 15 mJ/cm$^2$ to form a line-and-space pattern having a line width of 0.25 μm.

(EXAMPLE 11)

To 2.5 g of an alkali-soluble resin comprising polyhydroxystyrene (weight average molecular weight: 5,100) which is introduced with t-butoxycarbonyl group as an acid-decomposable group via 26 mol. % of hydroxyl group thereof was added 0.05 g of a photo-acid-generating agent (PAG-1) to obtain a mixture, which was then dissolved into 7.5 g of ethyl cellosolve acetate to prepare a photo-sensitive composition of Example 11. This photo-sensitive composition was then coated on the surface of a silicon wafer by means of a spin-coating method at the rotational speed of 3,000 r.p.m. over a time period of 30 seconds. Then, the coated layer was dried on a hot plate at a temperature of 110° C. for 100 seconds, thereby forming a resist film having a film thickness of 0.94 μm.

Then, the resist film was irradiated through a predetermined pattern of line-and-space with KrF excimer laser beam having a wavelength of 248 nm which was employed as a light source. The resist film thus light-exposed was then subjected to a baking step at a temperature of 120° C. for 90 seconds. Subsequently, the resist film thus baked was developed with a 0.28N aqueous solution of tetramethylammonium hydroxide at a temperature of 25° C. for 60 seconds to obtain a positive type resist pattern. As a result, it was possible with an exposure dosage of 38 mJ/cm$^2$ to form a line-and-space pattern having a line width of 0.35 μm.

(EXAMPLE 12)

The same procedures as explained in Example 11 repeated except that the photo-acid-generating agent (PAG-1) was replaced by the same amount of (PAG-2) thereby to form a positive type resist pattern. As a result, it was possible with an exposure dosage of 35 mJ/cm$^2$ to form a line-and-space pattern having a line width of 0.25 μm.

(EXAMPLE 13)

The same procedures as explained in Example 11 repeated except that the photo-acid-generating agent (PAG-1) was replaced by the same amount of (PAG-3) thereby to form a positive type resist pattern. As a result, it was possible with an exposure dosage of 24 mJ/cm$^2$ to form a line-and-space pattern having a line width of 0.30 μm.

(EXAMPLE 14)

The same procedures as explained in Example 11 repeated except that the photo-acid-generating agent (PAG-1) was replaced by the same amount of (PAG-4) thereby to form a positive type resist pattern. As a result, it was possible with an exposure dosage of 44 mJ/cm$^2$ to form a line-and-space pattern having a line width of 1.0 μm.

(EXAMPLE 15)

To 1.5 g of a quadripolymer (weight average molecular weight: 16,000) comprising methyl methacrylate, methyl acrylate, t-butyl methacrylate and naphthyl methacrylate (30:30:30:10) having an acid-decomposable group was added 0.06 g of a photo-acid-generating agent (PAG-1) to obtain a mixture, which was then dissolved into 8.5 g of ethyl cellosolve acetate to prepare a photo-sensitive composition of Example 15. This photo-sensitive composition was then coated on the surface of a silicon wafer by means of a spin-coating method at the rotational speed of 3,000 r.p.m. over a time period of 30 seconds. Then, the coated layer was dried on a hot plate at a temperature of 110° C. for 100 seconds, thereby forming a resist film having a film thickness of 0.55 μm.

Then, the resist film was irradiated through a predetermined pattern of line-and-space with ArF excimer laser beam having a wavelength of 193 nm which was employed as a light source. The resist film thus light-exposed was then subjected to a baking step at a temperature of 100° C. for 180 seconds. Subsequently, the resist film thus baked was developed with a 0.014N aqueous solution of tetramethylammonium hydroxide at a temperature of 25° C. for 15 seconds to obtain a positive type resist pattern. As a result, it was possible with an exposure dosage of 230 mJ/cm$^2$ to form a line-and-space pattern having a line width of 0.25 μm.

(EXAMPLE 16)

The same procedures as explained in Example 15 repeated except that the photo-acid-generating agent (PAG-1) was replaced by the same amount of (PAG-2) thereby to form a positive type resist pattern. As a result, it was possible with an exposure dosage of 260 mJ/cm$^2$ to form a line-and-space pattern having a line width of 0.18 μm.

(EXAMPLE 17)

The same procedures as explained in Example 15 repeated except that the photo-acid-generating agent (PAG-1) was replaced by the same amount of (PAG-3) thereby to form a positive type resist pattern. As a result, it was possible with an exposure dosage of 180 mJ/cm$^2$ to form a line-and-space pattern having a line width of 0.20 μm.

(EXAMPLE 18)

The same procedures as explained in Example 15 repeated except that the photo-acid-generating agent (PAG-1) was replaced by the same amount of (PAG-4) thereby to form a positive type resist pattern. As a result, it was possible with an exposure dosage of 150 mJ/cm$^2$ to form a line-and-space pattern having a line width of 1.0 μm.

(EXAMPLE 19)

To 1.2 g of a terpolymer (weight average molecular weight: 13,000) comprising methyl acrylate, t-butyl methacrylate and menthyl methacrylate (35:35:30) having an acid-decomposable group was added 0.06 g of a photo-acid-generating agent (PAG-1) to obtain a mixture, which was then dissolved into 8.8 g of cyclohexanone to prepare a photo-sensitive composition of Example 19. This photo-sensitive composition was then coated on the surface of a silicon wafer by means of a spin-coating method at the rotational speed of 3,000 r.p.m. over a time period of 30 seconds. Then, the coated layer was dried on a hot plate at a temperature of 110° C. for 100 seconds, thereby forming a resist film having a film thickness of 0.50 μm.

Then, the resist film was irradiated through a predetermined pattern of line-and-space with ArF excimer laser beam having a wavelength of 193 nm which was employed as a light source. The resist film thus light-exposed was then subjected to a baking step at a temperature of 120° C. for 180 seconds. Subsequently, the resist film thus baked was developed with a 0.14N aqueous solution of tetramethylammonium hydroxide at a temperature of 25° C. for 15 seconds to obtain a positive type resist pattern. As a result, it was possible with an exposure dosage of 55 mJ/cm$^2$ to form a line-and-space pattern having a line width of 0.55 μm.

(EXAMPLE 20)

The same procedures as explained in Example 19 repeated except that the photo-acid-generating agent (PAG-1) was replaced by the same amount of (PAG-2) thereby to form a positive type resist pattern. As a result, it was possible with an exposure dosage of 72 mJ/cm$^2$ to form a line-and-space pattern having a line width of 0.45 μm.

(EXAMPLE 21)

The same procedures as explained in Example 19 repeated except that the photo-acid-generating agent (PAG- 1) was replaced by the same amount of (PAG-3) thereby to form a positive type resist pattern. As a result, it was possible with an exposure dosage of 34 mJ/cm$^2$ to form a line-and-space pattern having a line width of 0.25 μm.

(EXAMPLE 22)

The same procedures as explained in Example 19 repeated except that the photo-acid-generating agent (PAG-1) was replaced by the same amount of (PAG-4) thereby to form a positive type resist pattern. As a result, it was possible with an exposure dosage of 30 mJ/cm$^2$ to form a line-and-space pattern having a line width of 1.5 μm.

(EXAMPLE 23)

To 0.9 g of a terpolymer (weight average molecular weight: 13,000) comprising methyl acrylate, t-butyl methacrylate and menthyl methacrylate (35:35:30) having an acid-decomposable group was added 0.9 g of naphthol novolak (weight average molecular weight: 1,000) as a solubility-inhibiting agent and 0.06 g of a photo-acid-generating agent (PAG-1) to obtain a mixture, which was then dissolved into 8.8 g of cyclohexanone to prepare a photo-sensitive composition of Example 23. This photo-sensitive composition was then coated on the surface of a silicon wafer by means of a spin-coating method at the rotational speed of 3,000 r.p.m. over a time period of 30 seconds. Then, the coated layer was dried on a hot plate at a temperature of 110° C. for 100 seconds, thereby forming a resist film having a film thickness of 0.48 μm.

Then, the resist film was irradiated through a predetermined pattern of line-and-space with ArF excimer laser beam having a wavelength of 193 nm which was employed as a light source. The resist film thus light-exposed was then subjected to a baking step at a temperature of 120° C. for 180 seconds. Subsequently, the resist film thus baked was developed with a 0.28N aqueous solution of tetramethylammonium hydroxide at a temperature of 25° C. for 30 seconds to obtain a positive type resist pattern. As a result, it was possible with an exposure dosage of 35 mJ/cm$^2$ to form a line-and-space pattern having a line width of 0.35 μm.

(EXAMPLE 24)

The same procedures as explained in Example 23 repeated except that the photo-acid-generating agent (PAG-1) was replaced by the same amount of (PAG-2) thereby to form a positive type resist pattern. As a result, it was possible with an exposure dosage of 42 mJ/cm$^2$ to form a line-and-space pattern having a line width of 0.30 μm.

(EXAMPLE 25)

The same procedures as explained in Example 23 repeated except that the photo-acid-generating agent (PAG-1) was replaced by the same amount of (PAG-3) thereby to form a positive type resist pattern. As a result, it was possible with an exposure dosage of 30 mJ/cm$^2$ to form a line-and-space pattern having a line width of 0.25 am.

(EXAMPLE 26)

The same procedures as explained in Example 23 repeated except that the photo-acid-generating agent (PAG-1) was replaced by the same amount of (PAG-4) thereby to form a positive type resist pattern. As a result, it was possible with an exposure dosage of 36 mJ/cm$^2$ to form a line-and-space pattern having a line width of 1.2 μm.

(EXAMPLE 27)

To 1.5 g of a copolymer (weight average molecular weight: 15,000) comprising acrylic acid and menthyl methacrylate (60:40) and employed as an alkali-soluble resin was added 0.3 g of di-t-butoxycarbonylated 1,5-naphthodiol represented by the following chemical formula as a solubility-inhibiting agent and 0.06 g of a photo-acid-generating agent (PAG-1) to obtain a mixture, which was then dissolved into 8.2 g of cyclohexanone to prepare a photo-sensitive composition of Example 27. This photo-sensitive composition was then coated on the surface of a silicon wafer by means of a spin-coating method at the rotational speed of 3,000 r.p.m. over a time period of 30 seconds. Then, the coated layer was dried on a hot plate at a temperature of 110° C. for 100 seconds, thereby forming a resist film having a film thickness of 0.45 μm.

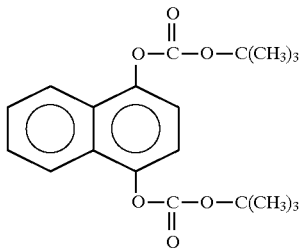

Then, the resist film was irradiated through a predetermined pattern of line-and-space with ArF excimer laser beam having a wavelength of 193 nm which was employed as a light source. The resist film thus light-exposed was then subjected to a baking step at a temperature of 120° C. for 180 seconds. Subsequently, the resist film thus baked was developed with a 0.28N aqueous solution of tetramethylammonium hydroxide at a temperature of 25° C. for 30 seconds to obtain a positive type resist pattern. As a result, it was possible with an exposure dosage of 50 mJ/cm$^2$ to form a line-and-space pattern having a line width of 0.35 μm.

(EXAMPLE 28)

The same procedures as explained in Example 27 repeated except that the photo-acid-generating agent (PAG-1) was replaced by the same amount of (PAG-2) thereby to form a positive type resist pattern. As a result, it was possible with an exposure dosage of 65 mJ/cm$^2$ to form a line-and-space pattern having a line width of 0.30 μm.

(EXAMPLE 29)

The same procedures as explained in Example 27 repeated except that the photo-acid-generating agent (PAG-1) was replaced by the same amount of (PAG-3) thereby to form a positive type resist pattern. As a result, it was possible with an exposure dosage of 35 mJ/cm$^2$ to form a line-and-space pattern having a line width of 0.25 μm.

(EXAMPLE 30)

The same procedures as explained in Example 27 repeated except that the photo-acid-generating agent (PAG-1) was replaced by the same amount of (PAG-4) thereby to form a positive type resist pattern. As a result, it was possible with an exposure dosage of 42 mJ/cm$^2$ to form a line-and-space pattern having a line width of 1.0 μm.

(EXAMPLE 31)

The same procedures as explained in Example 27 repeated except that the aforementioned solubility-inhibiting agent of di-t-butoxycarbonylated 1,5-naphthodiol was replaced by the same amount of di-t-butoxycarbonylated 1,1'-bis(4-hydroxynaphthyl)cyclohexane represented by the following chemical formula thereby to form a positive type resist pattern. As a result, it was possible with an exposure dosage of 55 mJ/cm² to form a line-and-space pattern having a line width of 0.35 µm.

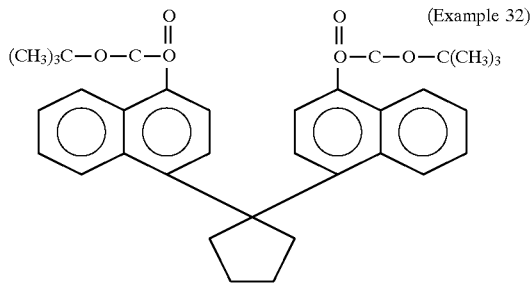

(EXAMPLE 32)

The same procedures as explained in Example 27 repeated except that the aforementioned solubility-inhibiting agent of di-t-butoxycarbonylated 1,5-naphthodiol was replaced by the same amount of di-t-butoxycarbonylated 1,1'-bis(4-hydroxynaphthyl)cyclopentane represented by the following chemical formula thereby to form a positive type resist pattern. As a result, it was possible with an exposure dosage of 52 mJ/cm² to form a line-and-space pattern having a line width of 0.35 µm.

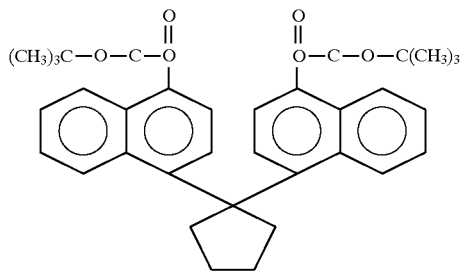

As explained above, it is possible with the photo-sensitive composition of this invention to form a resist pattern of excellent resolution with a high sensitivity by making use of not only KrF excimer laser beam, but also ArF excimer laser beam as a light source. Namely, it has been confirmed that the photo-sensitive composition according to this invention is applicable, as a chemically amplified resist of ultra-high sensitivity, not only to a light of short wave-length such as ArF excimer laser having a wavelength of 193 nm, but also to a light of wide range of wavelength.

(EXAMPLE 33)

To a random copolymer of methyl methacrylate and t-buthyl methacrylate 0.1% by weight of the photo-sensitive composition according to this invention was added to form a mixture, and this mixture was dissolved in ethyl cellosolve acetate to obtain a solution.

This solution was coated on the surface of a silicon wafer by means of a spin-coating, then the resist layer was dried on a hot plate at a temperature of 120° C. for 90 seconds thereby forming a resist film having a thickness of 0.30 µm.

Then, the resist film was irradiated with $F_2$ excimer laser beam (λ=159 nm) having 5 mm of diameter. The resist film thus light-exposed was then subjected to a baking step at 100° C. for 90 seconds. Subsequently, the resist film thus baked was developed with a 0.14N aqueous solution of tetramethylammonium hydroxide. As a result, the resist film was dissolved in the aqueous solution when irradiated with the $F_2$ excimer laser at an exposure dosage as follows.

Photo-acid-generating agents mixed to the photo-sensitive composition according to this invention and values of the exposure dosage are summarized below.

| photo-acid-genetating agent | exposure dosage |
|---|---|
| PAG-1 | 52 mJ/cm² |
| PAG-2 | 70 mJ/cm² |
| PAG-3 | 43 mJ/cm² |
| PAG-4 | 86 mJ/cm² |

As explained above, the photo-sensitive composition of this invention has sensitivity to $F_2$ excimer laser beam.

Therefore, it is possible according to this invention to provide a photo-sensitive composition which is excellent in transparency to ArF excimer laser and $F_2$ excimer laser having a very short wavelength, and capable of forming a resist pattern of excellent resolution with a high sensitivity.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A photo-sensitive composition for forming a pattern through a light-exposure with either one of ArF excimer laser and $F_2$ excimer laser, which comprises:

a compound having an acid-decomposable group; and a compound represented by the general formula (1):

wherein $Ar^1$ and $Ar^2$ are individually an aromatic ring or condensed aromatic ring; $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; Z is a group selected from the group consisting of Cl, Br, I, S—R and Se—R (R is an alkyl group having 1 to 10 carbon atoms or perfluoroalkyl group having 1 to 10 carbon atoms); and m and n are 0 or a positive integer.

2. The photosensitive composition according to claim 1, wherein said $Ar^1$ and $Ar^2$ are both formed of benzene ring.

3. The photosensitive composition according to claim 2, wherein said compound represented by the general formula (1) is selected from at least one kind of the compounds represented by the following general formulas (2), (3) and (4):

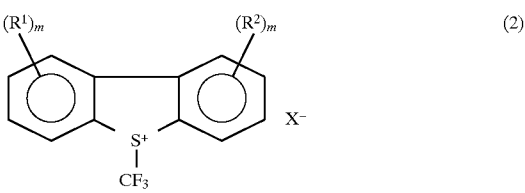

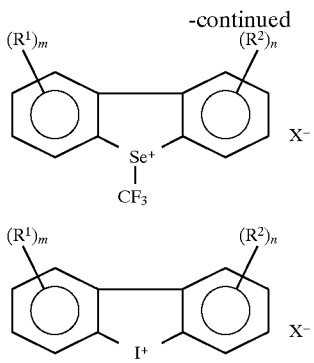

(3)

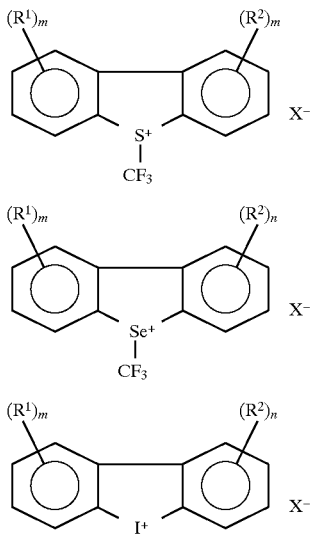

(4)

wherein $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; and m and n are 0 or a positive integer.

4. The photosensitive composition according to claim 3, wherein said $R^1$ and $R^2$ are individually an alkyl group having not more than 6 carbon atoms.

5. The photosensitive composition according to claim 1, wherein the content of said compound represented by the general formula (1) is not less than 0.1 mol. % based on said acid-decomposable group.

6. The photosensitive composition according to claim 5, wherein the content of said compound represented by the general formula (1) is in the range from 0.5 mol. % to 5 mol. % based on said acid-decomposable group.

7. The photosensitive composition according to claim 1, which further comprises an alkali-soluble resin.

8. The photosensitive composition according to claim 7, wherein said compound represented by the general formula (1) is selected from at least one kind of the compounds represented by the following general formulas (2), (3) and (4):

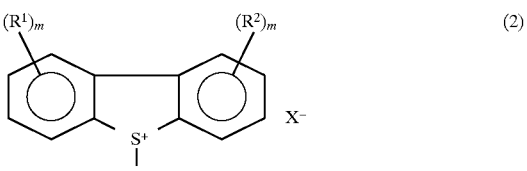

(2)

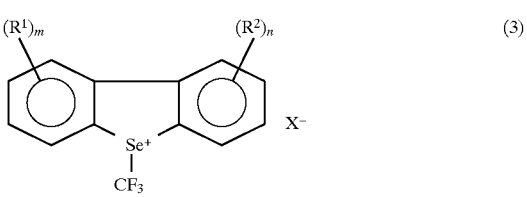

(3)

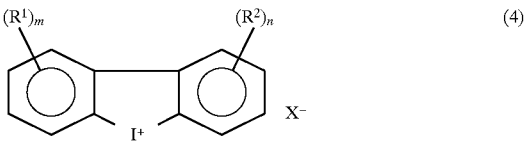

(4)

wherein $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; and m and n are 0 or a positive integer.

9. A photosensitive composition for forming a pattern through a light-exposure with either one of ArF excimer laser and $F_2$ excimer laser, which comprises a resin having an acid-decomposable group and a compound represented by the following general formula (1):

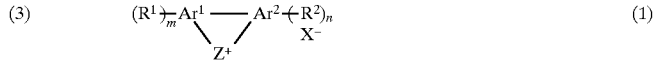

(1)

wherein $Ar^1$ and $Ar^2$ are individually an aromatic ring or condensed aromatic ring; $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; Z is a group selected from the group consisting of Cl, Br, I, S—R and Se—R (R is an alkyl group having 1 to 10 carbon atoms or perfluoroalkyl group having 1 to 10 carbon atoms); and m and n are 0 or a positive integer.

10. The photosensitive composition according to claim 9, wherein said compound represented by the general formula (1) is selected from at least one kind of the compounds represented by the following general formulas (2), (3) and (4):

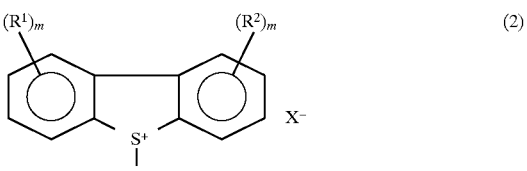

(2)

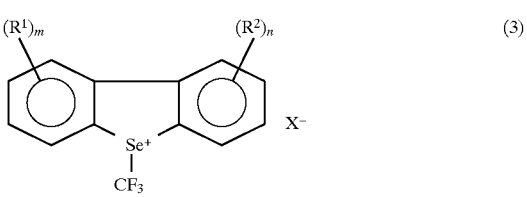

(3)

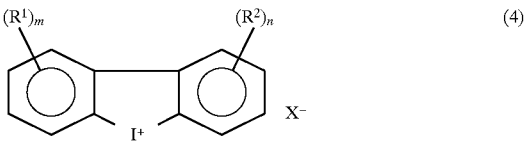

(4)

wherein $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; and m and n are 0 or a positive integer.

11. A photosensitive composition for forming a pattern through a light-exposure with either one of ArF excimer laser and $F_2$ excimer laser, which comprises a compound having an acid-crosslinkable group and a compound represented by the following general formula (1):

(1)

wherein $Ar^1$ and $Ar^2$ are individually an aromatic ring or condensed aromatic ring; $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; Z is a group selected from the group consisting of Cl, Br, I, S—R and Se—R (R is an alkyl group having 1 to 10 carbon atoms or perfluoroalkyl group having 1 to 10 carbon atoms); and m and n are 0 or a positive integer.

12. The photosensitive composition according to claim 11, wherein said $Ar^1$ and $Ar^2$ are both formed of benzene ring.

13. The photosensitive composition according to claim 12, wherein said compound represented by the general formula (1) is selected from at least one kind of the compounds represented by the following general formulas (2), (3) and (4):

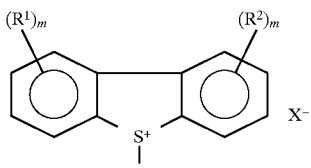 (2)

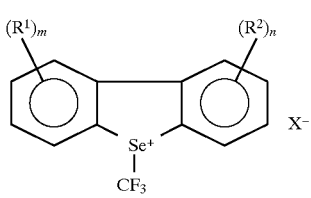 (3)

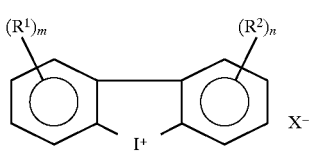 (4)

wherein $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; and m and n are 0 or a positive integer.

14. The photosensitive composition according to claim 13, wherein said $R^1$ and $R^2$ are individually an alkyl group having not more than 6 carbon atoms.

15. The photosensitive composition according to claim 11, wherein the content of said compound represented by the general formula (1) is not less than 1 mol. % based on said acid-decomposable group.

16. The photosensitive composition according to claim 15, wherein the content of said compound represented by the general formula (1) is in the range from 5 mol. % to 20 mol. % based on said acid-decomposable group.

17. The photosensitive composition according to claim 11, which further comprises an alkali-soluble resin.

18. The photosensitive composition according to claim 17, wherein said compound represented by the general formula (1) is selected from at least one kind of the compounds represented by the following general formulas (2), (3) and (4):

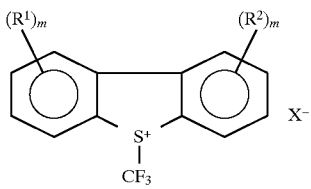 (2)

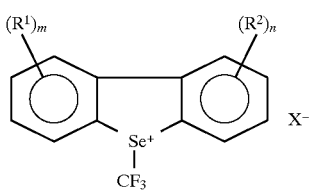 (3)

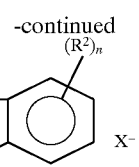 (4)

wherein $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; and m and n are 0 or a positive integer.

19. A photosensitive composition for forming a pattern through a light-exposure with either one of ArF excimer laser and $F_2$ excimer laser, which comprises a resin having an acid-crosslinkable group and a compound represented by the following general formula (1):

 (1)

wherein $Ar^1$ and $Ar^2$ are individually an aromatic ring or condensed aromatic ring; $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; Z is a group selected from the group consisting of Cl, Br, I, S—R and Se—R (R is an alkyl group having 1 to 10 carbon atoms or perfluoroalkyl group having 1 to 10 carbon atoms); and m and n are 0 or a positive integer.

20. The photosensitive composition according to claim 19, wherein said compound represented by the general formula (1) is selected from at least one kind of the compounds represented by the following general formulas (2), (3) and (4):

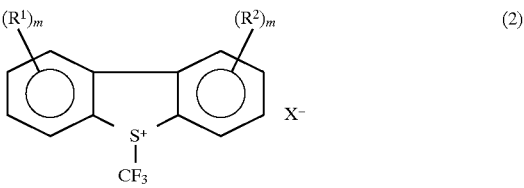 (2)

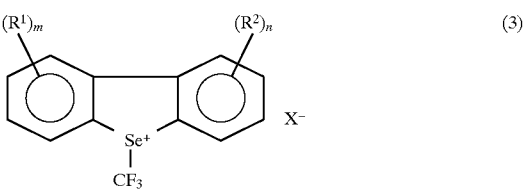 (3)

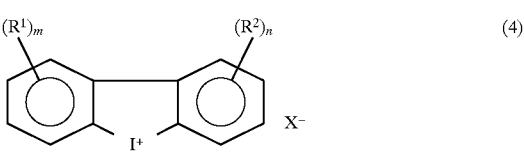 (4)

wherein $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; and m and n are 0 or a positive integer.

21. The photosensitive composition according to claim 2, wherein said compound represented by the general formula (1) is selected from at least one kind of the compounds represented by the following general formulas (2) and (3):

and (3):

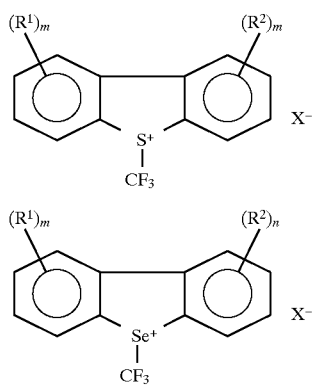

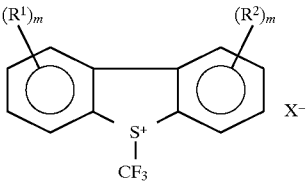

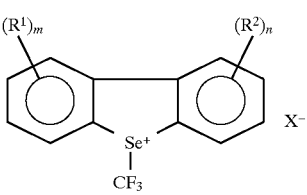

wherein $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; and m and n are 0 or a positive integer.

22. The photosensitive composition according to claim 12, wherein said compound represented by the general formula (1) is selected from at least one kind of the compounds represented by the following general formulas (2) and (3):

wherein $R^1$ and $R^2$ are individually halogen atoms or monovalent organic group; X is a group selected from the group consisting of $CF_3SO_3$, $CH_3SO_3$, $CF_3COOH$, $ClO_4$, $SbF_6$ and $AsF_6$; and m and n are 0 or a positive integer.

* * * * *